(12) United States Patent
Maki et al.

(10) Patent No.: US 6,373,106 B2
(45) Date of Patent: *Apr. 16, 2002

(54) SEMICONDUCTOR DEVICE AND METHOD FOR FABRICATING THE SAME

(75) Inventors: Yukio Maki; Hiroki Honda, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/827,582

(22) Filed: Mar. 28, 1997

(30) Foreign Application Priority Data

Sep. 10, 1996 (JP) .............................. 8-239347

(51) Int. Cl.⁷ ........................ H01L 29/76; H01L 29/94
(52) U.S. Cl. ................... 257/369; 257/371; 257/402; 257/509
(58) Field of Search ................. 257/371, 368, 257/369, 391, 392, 394, 402, 509, 345, 500, 372, 374; 438/398, 399, 400, 208, 217, 223, 224, 225

(56) References Cited

U.S. PATENT DOCUMENTS

| 4,859,619 A | * | 8/1989 | Wu et al. | 438/201 |
|---|---|---|---|---|
| 4,868,628 A | | 9/1989 | Simmons | 257/378 |
| 4,893,164 A | | 1/1990 | Shirato | 257/392 |
| 5,128,739 A | | 7/1992 | Shirato | 257/371 |
| 5,210,437 A | | 5/1993 | Sawada et al. | 257/392 |
| 5,480,816 A | | 1/1996 | Uga et al. | 438/309 |
| 5,483,483 A | | 1/1996 | Choi et al. | 257/378 |

FOREIGN PATENT DOCUMENTS

| JP | 60-10769 | | 1/1985 |
|---|---|---|---|
| JP | 61-166155 | | 7/1986 |
| JP | 62-276868 | | 12/1987 |
| JP | 4-242934 | | 8/1992 |
| JP | 5-275710 | | 10/1993 |
| JP | 6-163890 | * | 6/1994 |
| JP | 7-193134 | | 7/1995 |

OTHER PUBLICATIONS

Lee, K.F., et al: "Room Temperature 0.1 μm CMOS Technology with 11.8 ps Gate Delay", *IEEE*, 1993, pp. 131–134.
Takeuchi, K., et al: "0.15μm CMOS with High Reliability and Performance", *IEEE*, 1993, pp. 883–886.
J.D. Hayden et al. "An Ultra–Shallow Link Base for a Double Polysilicon Bipolar Transistor" pp. 96–99 1992.

* cited by examiner

*Primary Examiner*—Steven Loke
*Assistant Examiner*—Hung Kim Vu
(74) *Attorney, Agent, or Firm*—McDermott, Will & Emery

(57) ABSTRACT

In a MOS semiconductor device including a normal MOS transistor and an output MOS transistor for an input/output buffer, the normal MOS transistor is formed in a normal well. In an output MOS transistor, the channel region of the second MOS transistor and an element isolation region are formed in the region of a higher impurity concentration. On the other hand, the source and drain regions are formed in a lower impurity concentration region. Thereby, the source/drain capacitance of the output MOS transistor may be reduced, and the input/output capacitance of the semiconductor device may be reduced.

7 Claims, 12 Drawing Sheets

——— Surge Breakdown Voltage
—·— Junction Capacitance

NMOS Tr          Output NMOS Tr.

NMOS Tr          Output NMOS Tr.

SEMICONDUCTOR DEVICE AND METHOD FOR FABRICATING THE SAME

TECHNICAL FIELD

The present invention relates to a semiconductor device and a method for fabricating the same, and in particular to a structure of a MOS transistor and a method for fabricating the same for constituting an input/output buffer circuit having a CMOS structure.

BACKGROUND ART

FIG. 11 shows a sectional view of a conventional NMOS transistor. As shown in FIG. 11, the transistor comprises a semiconductor substrate 101, and element isolation regions 102 formed on the surface of an inactive region of the semiconductor substrate 101. A P-well 103 is formed up to a predetermined depth from the surface of the semiconductor substrate 101, and source/drain regions 104 containing N-type impurities are formed on the surface of the semiconductor substrate 101. A channel region 105 is formed between two source/drain regions 104. A gate oxide film 106 is formed on the channel region 105, and a gate electrode 107 is formed on the gate oxide film 106. Further, a side wall 108 is formed on the lateral section of the gate electrode 107.

Further, though not illustrated in the sectional view of FIG. 11, a contact is formed respectively on the surface of the source/drain regions 104 which appears in cross section in the gate length direction.

Furthermore, in the case of a device in which the NMOS transistor in FIG. 11 follows a design rule of 0.6 μm or less, the P-well 103 has at most an impurity concentration of approximately. 3.0 E17/cm$^3$.

When the maximum impurity concentration of the P-well 103 is more than 3.0 E17/cm$^3$, junction capacitance of an N-type high impurity concentration region of the source/drain regions 104 increases, and as a result, electrical characteristics of the NMOS transistor deteriorate.

Moreover, as the semiconductor device is reduced in size, the impurity concentration in the well tends to be increased. Then, the capacitance of the PN junction between the P-well 103 and the source/drain regions 104 increases. As a result, in the product specification, the criterion of 10 pF or less of input/output capacitance in an input/output buffer portion can be hardly met.

In the following, a method for fabricating a semiconductor device having a CMOS structure including the NMOS transistor in FIG. 11 is described with reference to FIGS. 12(a) to 12(d).

FIG. 12(a) shows a sectional structure of a transistor to be finally obtained, in which a PMOS transistor forming portion is shown at the left, an NMOS transistor forming portion is shown at the center, and a memory cell forming portion is shown at the right.

First, as shown in FIG. 12(b), a mask 109 is formed on an NMOS transistor forming region and a memory-cell forming region on the semiconductor substrate 101 having the element isolation region 102 serving as an inactive region, and N-type impurities are implanted into a PMOS transistor forming region to form an N-well 110 using the mask 109 as an ion implantation mask. Thereafter, the mask 109 is removed.

Then, as shown in FIG. 12(c), a mask 111 is formed on a PMOS transistor forming region, and P-type impurity ions are implanted into an NMOS transistor forming region and a memory cell forming region to form a P-well 103 by using the mask 111 as an ion implantation mask. Therefore, the mask 111 is removed.

Thereafter, as shown in FIG. 12(d), a mask 112 is formed on PMOS and NMOS transistor forming regions, and impurities are implanted to form a threshold adjustment layer 113 on the surface of an active region of the memory cell forming region. Therefore, the mask 112 is removed.

Further, as shown in FIG. 12(a), gate oxide films 106 and 115 and gate electrodes 107 and 116 are formed in order. The source/drain regions 104 and 114 are formed by implanting N- or P-type impurities into the regions respectively. Then, side walls 108 and 117 are formed on the lateral sections of the gate electrodes 107 and 116. Thus, the transistor shown in FIG. 12(a) is formed. The threshold adjustment layer 113 is not illustrated in FIG. 12(a) for simplicity.

A semiconductor device comprising transistors of a ICMOS structure may be obtained by following the above fabrication steps. However, as already described, the transistor having the structure shown in FIG. 12(a) has a problem in that capacitance increases in the PN junction formed with a well and a source/drain region.

FIG. 13 shows the structure of a NMOS transistor which has a reduced junction capacitance. The structure of the NMOS transistor shown in FIG. 13 is different from that of the NMOS transistor shown in FIG. 11 in that a threshold adjustment layer 105a is formed in a region serving as a channel including ends of the two adjacent source/drain regions 104, and the impurity concentration of the P-well 103 is lower than that of the P-well 103 of the transistor shown in FIG. 11.

Generally, the threshold adjustment layer 105a is formed on the entire surface layer of an active region. However, in this case, the layer 105a is formed only on a channel region. Therefore, the impurity concentration of the P-well 103 which is located just under the source/drain region 104 with high concentration N type impurity may be made lower than that of the threshold adjustment layer 105a. Thus, the junction capacitance of the source-drain region 104 with the underling P-well 103 is decreased to a certain extent.

A method for fabricating a semiconductor device having a CMOS structure including the transistor shown in FIG. 13 is shown in FIG. 14(a) to FIG. 14(c).

First, similar steps as shown in FIGS. 12(b) and 12(c) are performed. Then, as shown in FIG. 14(a), a mask 118 is formed on the PMOS transistor forming region and on the NMOS transistor forming region except the channel region thereof. Then, P-type impurity ions are implanted with the mask 118 as an ion implantation mask to form the threshold adjustment layer 105a on the channel portion of the NMOS transistor forming region, and also to form the threshold adjustment layer 105a with the same concentration on the entire surface of the active region of a memory cell forming region. Thereafter, the mask 118 is removed.

Then, similarly as shown in FIG. 12(d), the mask 112 is formed on the PMOS and NMOS transistor forming regions. Then, ions are additionally implanted into the memory cell region to form the threshold adjustment layer 113 as shown in FIG. 14(b). Thereafter, the mask 112 is removed.

Thereafter, the similar steps as explained with reference to FIG. 12(a) are performed, and thus the semiconductor device having a CMOS structure shown in FIG. 14(c) is obtained. As described above, this structure is different from that of the MOS transistor shown in FIG. 12(a) particularly in that the threshold adjustment layer 105a is formed in a region serving as the channel region of an NMOS transistor. Since the threshold adjustment layer 105a is formed, the impurity concentration of the P-well 103 underlying the source/drain region may be reduced 104. Therefore, the junction capacitance between the source/drain region 104 and the P-well 103 may be reduced to a certain extent.

However, in the fabrication method as shown in FIG. 14(a) to FIG. 14 (c), the number of steps is increased compared to the fabrication method of the normal semiconductor device having a CMOS structure such as an SRAM as shown in FIG. 12. An additional mask (reticle), which is not necessary for normal SRAM fabrication, is required to form the mask 118 and to perform ion implantation. Therefore, fabrication cost is increased as the number of steps is increased.

With regard to the semiconductor substrate 101 as shown in FIG. 11 to FIG. 14(d), an N-type substrate is used for a CMOSSRAM, and a P-type substrate is used for a Bi-CMOSSRAM which includes bipolar transistors.

Another method for reducing the junction capacitance of a MOS transistor is disclosed in Japanese Patent Application Laid-Open No. 7-193134. In the method, a MOS transistor comprised in a logic circuit portion is fabricated so as to have a structure almost the same as that shown in FIG. 13. In the case of this structure, the channel ion implantation region 105a (i.e. a threshold adjustment layer 105a in FIG. 13) is formed only nearby the gate electrode 107, and thereby the junction capacitance between the source/drain region 104 and the channel ion implantation region 105a is reduced. Moreover, in MOS transistors for forming memory cells, channel ions are implanted to the whole active region and to element isolation regions 102 passing through a field oxide film. Ions are increased in the field separation regions underneath the element isolation regions 102, and thereby field separation width may be reduced. Thus, integration density is improved.

However, in the case of the MOS transistor disclosed in Japanese Patent Application Laid-Open No. 7-193134, the channel ion implantation regions of the logic circuit portion and of the memory cell region are simultaneously formed, and therefore slight adjustment of a threshold value is difficult. Moreover, similarly to the case shown in FIG. 14, in order to implant ions for threshold adjustment into the channel region of the MOS transistors for memory cells, an additional mask is needed than the case of fabricating a conventional CMOSSRAM. Therefore, the fabrication process is complicated and fabrication cost is increased.

Moreover, the MOS transistor disclosed in Japanese Patent Application Laid-Open No. 7-193134 has a normal well structure, in which the whole transistor is formed on a P-well similarly to the case of the MOS transistor shown in FIG. 13. Therefore, it is possible to reduce junction capacitance at the boundary between the source/drain region and the P-well region to a certain extent, but it is difficult to greatly reduce the junction capacitance.

It is already described that the input/output capacitance of an input/output buffer portion increases as the junction capacitance between the source/drain region 104 and the P-well 103 increases. An input/output circuit is shown in FIG. 15 in conjunction with this problem.

As shown in FIG. 15, the output side and the input side of the input/output circuit respectively comprises an NMOS transistor and a PMOS transistor. Two transistors are connected each other at the output side, and the potential at a node between the two transistors is output and supplied to the gate electrodes of the two transistors at the input side. Moreover, the potential of the pad is equal to the output potential of the output side and the input potential of the input side.

The input/output capacitance of the input/output circuit is almost equal to the sum of the input-side gate capacitance and the output-side source/drain capacitance. The input-side gate capacitance depends on the thickness of the gate oxide film of the MOS transistor and increases as the thickness of the oxide film decreases. The output-side source/drain capacitance is determined in accordance with the well and source/drain concentration of the MOS transistor. Because a heavy current flows through the output-side transistor, the transistor has a large size, such as a gate width W of approximately several hundreds of microns, and thereby the junction capacitance of this portion is larger than of other portions.

In the conventional semiconductor device as described above, reduction of input/output capacitance to meet a product specification has become difficult. In the method to form a threshold adjustment layer 105a as shown in FIG. 13, reduction of input/output capacitance is achieved to a certain extent, however, the number of fabrication steps is increased.

DISCLOSURE OF THE INVENTION

Therefore, the purpose of the present invention is to provide a semiconductor device and a method of fabrication thereof which shows a reduced input/output capacitance without increasing number of fabrication steps.

According to one aspect of the present invention, a semiconductor device comprises at least a first and a second MOS transistor of the same conduction type formed on a semiconductor substrate. The first MOS transistor is formed in a well with a first impurity concentration. The second MOS transistor includes a channel region, a source region and a drain region. The channel region of the second MOS transistor, a region under the channel region and a region under an element isolation region located around the second MOS transistor are formed in each region of a first impurity concentration. The source region and drain region of the second MOS transistor are formed in contact with a region of a second impurity concentration, and the first impurity concentration is larger than the second impurity concentration.

In another aspect of the present invention, in the semiconductor device, the region of a first impurity concentration is formed by wells, and the region of a second impurity concentration is formed by the semiconductor substrate.

In another aspect of the present invention, in the semiconductor device, the region of a first impurity concentration is formed by wells and the region of a second impurity concentration is formed by another well.

According to another aspect of the present invention, a semiconductor device comprises at least a first and a second MOS transistor of the same conduction type formed on a semiconductor substrate. The first MOS transistor is formed in a well with a first impurity concentration. The second MOS transistor includes a channel region, a source region and a drain region. One of the channel region plus a region under the channel region of the second MOS transistor or a region under an element isolation region located around the second MOS transistor is formed by a region of a first impurity concentration. The source and drain regions of the second MOS transistor and the other one of the channel region plus the region under the channel region of the second MOS transistor or the region under an element isolation region are formed in contact with a region of a second impurity concentration, and the first impurity concentration is larger than the second impurity concentration.

In another aspect of the present invention, in the semiconductor device, the region of a first impurity concentration is formed by a well, and the region of a second impurity concentration is formed by the semiconductor substrate.

In another aspect of the present invention, in the semiconductor device, the channel region plus a region under the channel region of the second MOS transistor is formed by a region of a first impurity concentration. The source and drain regions of the second MOS transistor and the region under the element isolation region are formed in contact with a region of a second impurity concentration.

In another aspect of the present invention, in the semiconductor device, the width of the element isolation region is set not less than 5.0 μm.

In another aspect of the present invention, in the semiconductor device, the region under an element isolation region located around the second MOS transistor is formed by a region of a first impurity concentration. The source and drain regions of the second MOS transistor and the channel region plus the region under the channel region of the second MOS transistor are formed in contact with a region of a second impurity concentration.

In another aspect of the present invention, in the semiconductor device, the distance between a gate electrode of the second MOS transistor and a contact to a source region or a drain region is 0.5 to 3.0 μm.

In another aspect of the present invention, in the semiconductor device, the second MOS transistor is applied for an output portion of an input/output buffer of the semiconductor device.

According to another aspect of the present invention, in a method for fabricating a semiconductor device including at least a first and a second MOS transistors, a well of a first impurity concentration are formed in a region for the first MOS transistor. Simultaneously, other wells of the first impurity concentration is formed under a channel region of the second MOS transistor and under an element isolation region surrounding the second MOS transistor. Regions of a second impurity concentration are formed for source and drain regions, and the second impurity concentration is lower than the first impurity concentration.

BEST MODE FOR CARRYING OUT THE INVENTION

First Embodiment

Figure 1:
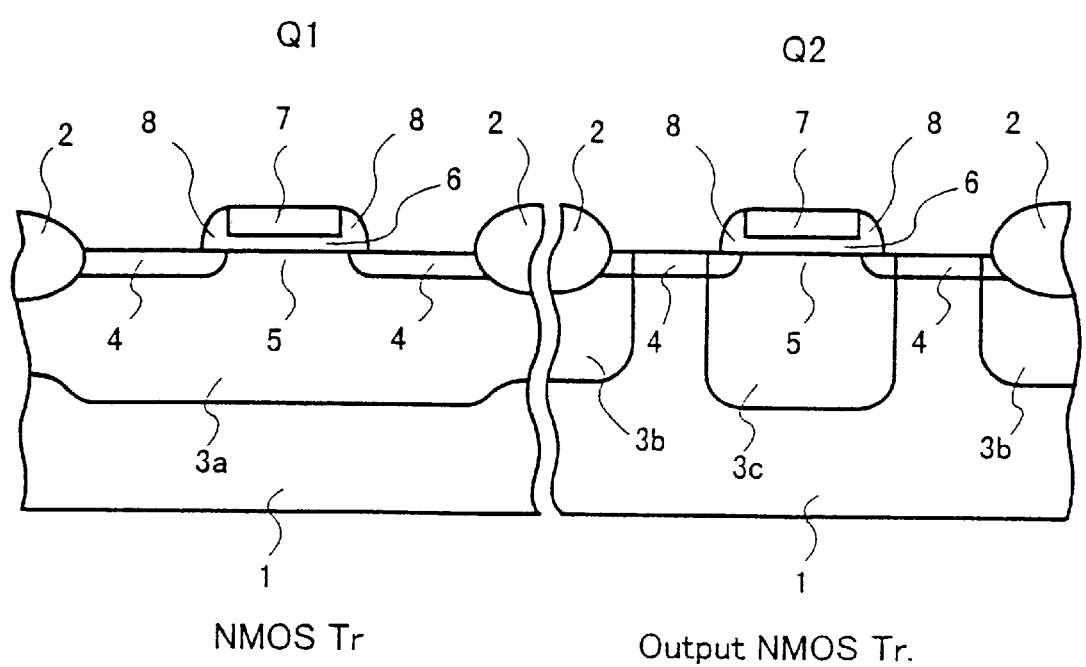
FIG. 1 shows a cross sectional view of NMOS transistors of a Semiconductor device according to a first embodiment of the present invention.

FIG. 1 shows a cross sectional view of a semiconductor device according to a first embodiment of the present invention. In FIG. 1, a cross section of a normal NMOS transistor Q1 (first MOS transistor) comprised in a logic circuit is shown at the left, and a cross section of an NMOS transistor Q2 (second MOS transistor) comprised particularly in an output-portion of an input/output buffer of a logic circuit is shown at the right.

As shown in FIG. 1, the semiconductor device is comprised of a semiconductor substrate 1 which has an impurity concentration of approximately 1.0 E15/cm$^3$ (second concentration of impurity). Element isolation regions 2 are formed by a method such as LOCOS oxidation on regions serving as inactive regions on the surface of the semiconductor substrate 1. A P-well 3a is formed up to a predetermined depth from the surface of the semiconductor substrate 1 in a normal NMOS-transistor forming region. When an element isolation region 2 around the normal NMOS transistor Q1 is formed so as to be raised from a principal plane of the semiconductor substrate 1, the P-well 3a is formed more shallowly than other portions underneath the element isolation region 2.

Source/drain regions 4 are formed so as to hold the surface region of the semiconductor substrate 1 which serves as a channel region 5. P-wells 3b are formed downward from the bottom of the element isolation region 2 which are in turn formed around the output NMOS transistor Q2. When the normal NMOS transistor Q1 and the output NMOS transistor Q2 are formed adjacent via the element isolation region 2, the P-well 3b is formed continuously from the P-well 3a underneath the element isolation region 2. In other words, the P-wells 3a and 3b are formed respectively under the element isolation region 2 which is adjacent the active regions of the normal NMOS transistor Q1 and the output NMOS transistor Q2.

Further, a P-well 3c is formed in and under the channel region 5 of the output NMOS transistor. The P-well 3c is formed so as to include each end portion of the source/drain regions 4 at the side of the channel region 5.

Further, each gate insulating film 6 made of an insulating film such as a silicon oxide film is formed on the channel region 5, and a gate electrode 7 is formed on the gate insulating film 6 over the channel region 5. Each side wall 8 made of an insulating film is formed so as to cover the lateral section of the gate electrodes 7.

Furthermore, the P-wells 3a, 3b, and 3c are formed so as to have an impurity concentration of 1.0 to 3.0 E17/cm³ generally (first concentration of impurity).

According to the structure of the present invention, the P-well structure of the NMOS transistor output portion is modified, so that capacitance is effectively reduced. Since capacitance can be more easily reduced in a transistor having a gate pattern with a larger width and a larger area, the modification in the output transistor is effective. The NMOS transistor of the output buffer portion requires a gate width of several hundreds of microns, and hence the capacitance can be reduced particularly effectively.

Figure 2:
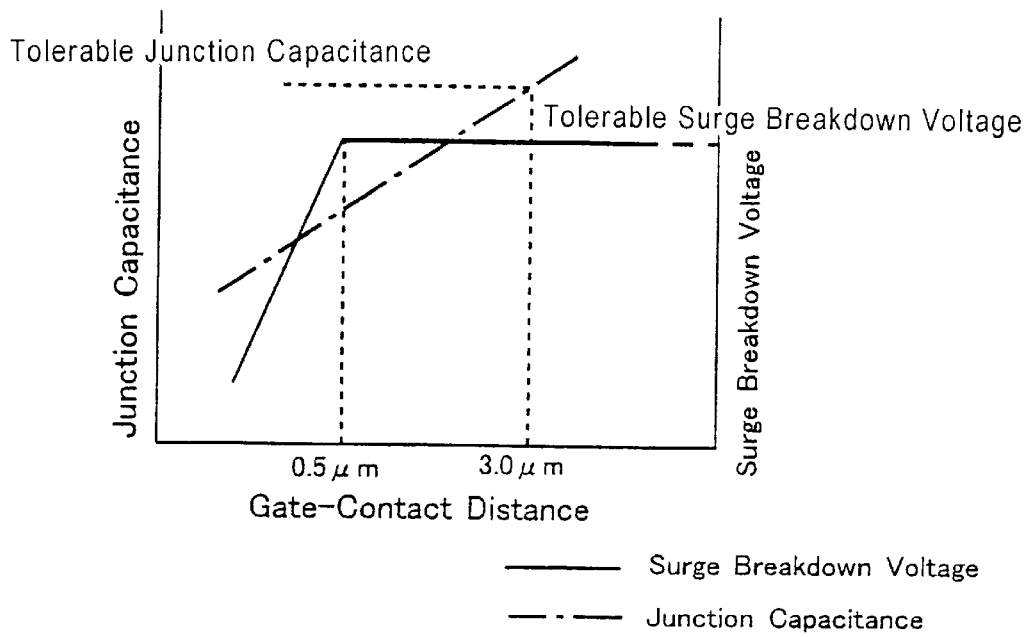
FIG. 2 shows the junction capacitance and the surge withstand voltage characteristic of a NMOS transistor for an output-portion of a semiconductor device according to the present invention.

FIG. 2 shows the junction capacitance and the surge withstand voltage characteristic of the above output-portion forming NMOS transistor. In FIG. 2, the Y axis shows junction capacitance and surge withstand voltage in an arbitrary unit. The X axis shows the gate-contact distance, that is, the distance between the gate electrode and the contact connected to a source/drain region. The dependency of junction capacitance on the gate-contact distance is shown by a chain line, and the dependency of surge withstand voltage on the gate-contact distance is shown by a solid line in the graph.

Figure 3:
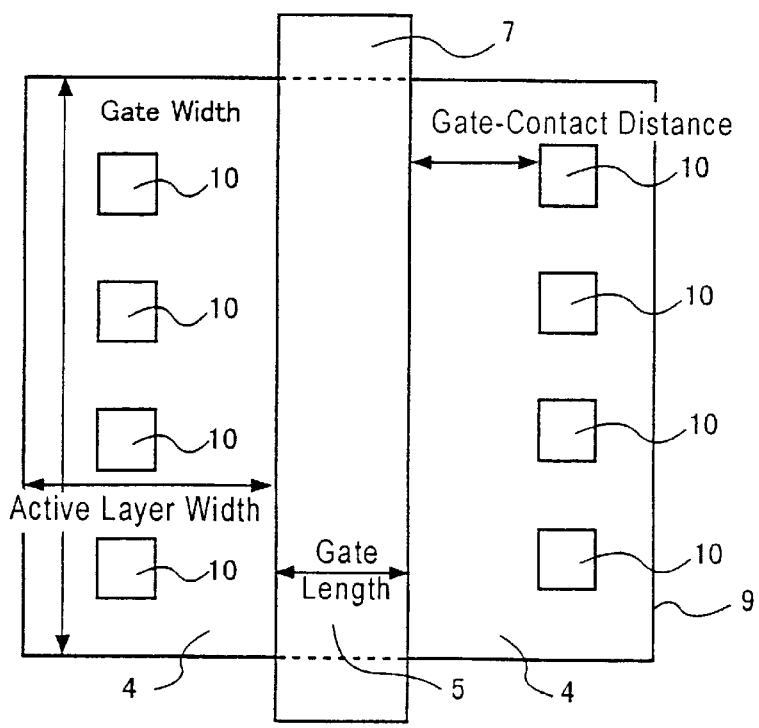
FIG. 3 is a top view of a MOS transistor showing gate-contact distance in a MOS transistor.
Figure 4:
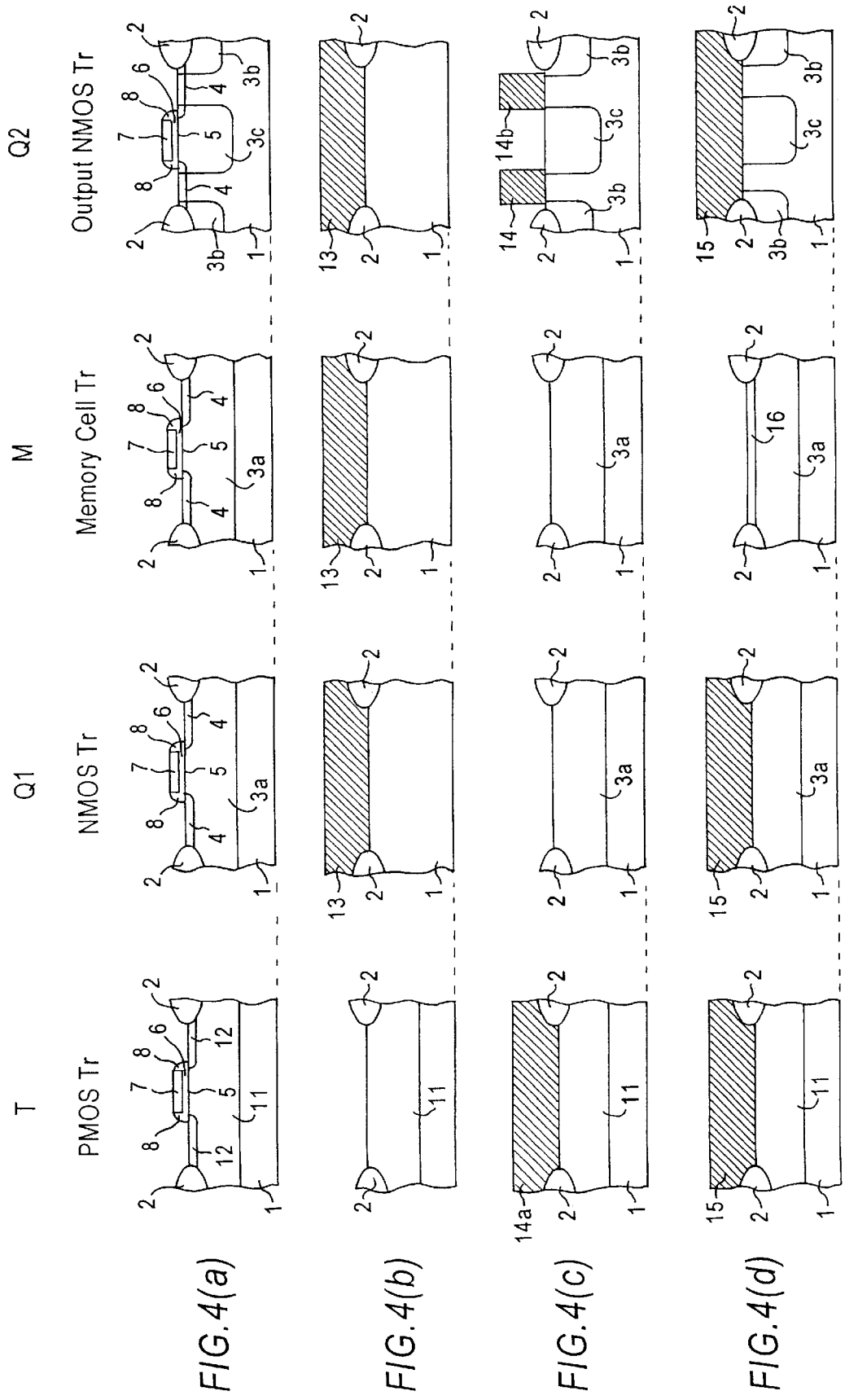
FIGS. 4(a) to 4(d) show a method for fabricating a CMOSSRAM according to the first embodiment of the present invention.

The concept of the gate-contact distance is shown in FIG. 3. As shown in the top view of a MOS transistor in FIG. 3, the gate electrode 7 is arranged so as to extend through the central portion on the active region 9 of the transistor. The surface layers of the active regions on both sides of the gate electrode 7 serve as the source/drain region 4. The portion where the active region 9 and the gate electrode 7 are superposed serves as the channel region 5. Moreover, a plurality of contacts 10 are formed so as to contact the surface of the source/drain regions 4 and to extend upward therefrom.

The gate-contact distance means the minimum distance between a side end of the gate electrode 7 and a side end of the contact 10. Further, as shown in FIG. 3, the gate width means the dimension of the active region 9 in the direction in which the gate electrode 7 extends, and the active layer width denotes the dimension of the source/drain region 4 in the direction of the gate length. The active layer width greatly depends on the dimension of the contacts 10 and the gate-contact distance.

With the background as explained above, it is understood from FIG. 2 that, in the characteristics of the NMOS transistor for the output-portion, junction capacitance is closely proportional to gate-contact distance. At a design rule level of 0.4 μm, the product specification of input/output capacitance is satisfied when gate-contact distance is 3.0 μm or less. Further, the surge withstand voltage attains an allowable value when the gate-contact distance is 0.5 μm or more.

Therefore, it is found that the present invention is particularly effective for a MOS transistor having a gate-contact distance of 0.5 to 3.0 μm.

Next, described below with reference to FIGS. 4(a) to 4(d) is a method for fabricating a CMOSSRAM which includes a normal NMOS transistor and an NMOS transistor for an output-portion as shown in FIG. 1 and which further includes a PMOS transistor and a memory cell transistor.

FIG. 4(a) shows cross sectional views of each transistor in a CMOSSRAM which is finally obtained. In FIG. FIG. 4(a), shown from left to right in order are a normal PMOS transistor T comprised in a logic circuit, a normal NMOS transistor Q1 comprised in a logic circuit, an NMOS transistor M for forming a memory cell portion, and finally an NMOS transistor Q2 for forming the output portion of an input/output buffer, which is the characteristic portion of the present invention. FIGS. 4(b) to 4(d) show the cross sections of the above MOS transistors in the same order. In FIG. 4(a), the PMOS transistor T includes an N-well 11 and a source/drain region 12 of a P-type high-concentration.

Then, the fabrication steps are described below sequentially. First, as shown in FIG. 4(b), the element isolation regions 2 are formed on the regions serving as the inactive regions of the semiconductor substrate 1 by the LOCOS oxidation method or the like. Then, the resist mask 13 is patterned on the NMOS transistor forming regions including the regions of transistors for a normal logic circuit, a memory cell and an output portion, so that only the PMOS transistor forming region is left exposed. Then, N-type impurity ions are implanted to form the N-well 11 in the PMOS transistor forming region up to a predetermined depth from the surface of the semiconductor substrate 1. Thereafter, the mask 13 is removed.

Then, as shown in FIG. 4(c), a mask 14a is formed on the PMOS transistor forming region, and at the same time, a mask 14b is formed on the regions 4 for the source/drain in the active regions of the output NMOS transistor Q2.

Then, P-type impurity ion implantation is performed to form the P-well 3a up to a predetermined depth from the surface of the semiconductor substrate 1 in the normal NMOS transistor forming region for a logic-circuit and a NMOS transistor forming region for a memory-cell. Simultaneously with formation of the P-well 3a, the P-well 3b is formed under the element isolation region 2 around the output NMOS transistor forming region, and the P-well 3c is formed in a surface region serving as the channel region 5 and up to a predetermined depth downward from the surface of the semiconductor substrate 1.

The P-wells 3a, 3b, and 3c are formed to have the same impurity concentration, and the peak concentration comes to approximately 3.0 E17/cm³ (first concentration of impurity). When the concentration of the P-wells 3a, 3b, and 3c is adjusted to 1.0 E17/CM³ or more, the P-wells 3a, 3b, and 3c may completely extract holes formed due to the hot carrier effect, and the well potential is stabilized without increasing the resistance of the P-wells. Thereafter, the masks 14a and 14b are removed.

Then, as shown in FIG. 4(d), a mask 15 is patterned on the regions other than the NMOS-transistor forming region for the memory-cell, and ions are selectively implanted into the surface layer of the active region of the NMOS transistor forming region. Thus, a threshold adjustment layer 16 is formed for adjusting the threshold level of the NMOS transistor M. The concentration of the threshold adjustment layer 16 is made to be higher than the impurity concentration of the channel regions of other NMOS-transistors. Thereafter, the mask 15 is removed.

Then, as shown in FIG. 4(a), each gate insulating film 6 is formed, and each gate electrode 7 is formed on the gate insulating film 6 over the channel region 5. Then, a side wall 8 made of an insulating film is formed on the lateral section of the gate electrode 7. Through the above steps, MOS transistors having the structure shown in FIG. 4(a) are obtained. The subsequent steps for forming each contact to the source/drain regions 4 or 12, or forming an interlayer insulating film and upper lead layer are not explained here.

As shown above, in the fabrication method of a CMOSS-RAM of the present invention, the P-wells 3b and 3c of an NMOS transistor comprised in an output portion May be simultaneously formed with the P-well 3a of other NMOS transistors. Further, the mask 14b serving as an ion implantation mask may be simultaneously formed with the mask 14a patterned on a PMOS transistor forming region. Therefore, the number of fabrication steps is not increased beyond the number of conventional fabrication steps.

In the NMOS transistor for the output-portion of the semiconductor device thus fabricated, portions of the N-type high-concentration regions of the source/drain regions 4 contact the P-wells 3b and 3c by a small surface different from the conventional NMOS transistor, and only end portions of the source/drain region 4 contact the P-wells 3b and 3c. The bottom surface of the source/drain region 4 contacts the low-concentration P-type semiconductor substrate 1, so that the junction capacitance of a PN junction formed at this portion is reduced. Therefore, source/drain capacitance is reduced compared to that of a transistor having a conventional structure.

The P-well 3c is formed under the channel region 5, and the impurity concentration of the P-well 3c can be set to a value capable of stabilizing a P-well potential. The P-well 3b is also formed under the element isolation region 2. Thereby, element separation capacity is increased, and the dimension for forming the element isolation region 2 is decreased compared to the case in which the P-well 3b is not formed. Therefore, there is an advantage that semiconductor elements can further be decreased in size.

Described above is a structure of an output NMOS transistor for an input/output buffer in which a P-type semiconductor substrate 1 is used. However, the above example can also be applied for forming an output PMOS transistor for an input/output buffer in which an N-type semiconductor substrate is used, and the same advantage as mentioned above can be obtained.

To form a Bi-CMOSSRAM including both bipolar transistors and MOS transistors like the above example, a P-type semiconductor substrate is used. However, to form a CMOSSRAM comprising MOS transistors, an N-type semiconductor substrate is used.

Further, a MOS transistor having the structure shown in FIG. 1 with reduced source/drain capacitance can be applied not only to the formation of a Bi-CMOSSRAM or CMOSSRAM but also to other semiconductor devices. Junction capacitance may be effectively reduced by applying the MOS transistor structure to any large scale transistors.

Second Embodiment

Figure 5:
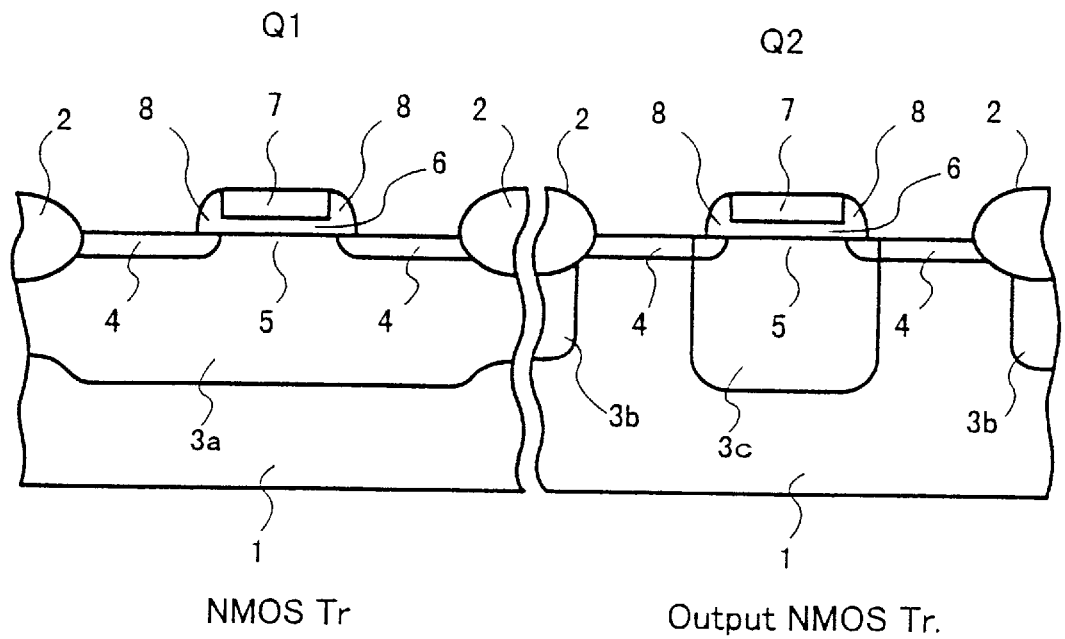
FIG. 5 shows a cross sectional view of a semiconductor device according to a second embodiment of the present invention.

A second embodiment of the present invention is described below. FIG. 5 shows a cross sectional view of a semiconductor device according to a second embodiment of the present invention. In FIG. 5, a cross section of a normal NMOS transistor Q1 (first MOS transistor) comprised in a logic circuit is shown at the left, and a cross section of an NMOS transistor Q2 (second MOS transistor) comprised in an output-portion of an input/output buffer of a logic circuit is shown at the right.

In the first embodiment described above, the P-well 3b of an output NMOS transistor Q2 is in contact with the source/drain region 4. In contrast, in the second embodiment, the P-well 3b of an output NMOS transistor Q2 is not in contact with the source/drain region 4 as shown in the right side of FIG. 5. In plan view, the boundary portion of the P-well 3b of the output NMOS transistor Q2 is formed inside of the outer periphery of the element isolation region 2.

The method for forming the NMOS transistor for output-portion shown in FIG. 5 is almost the same as that of the first embodiment except for the following point. In the fabrication step shown in FIG. 4(c), the mask 14b is formed on the region for forming the output NMOS transistor. At this time, the mask 14b is formed to cover the end portions of the element isolation region 2 so that the end portion of the region 2 is not exposed. Ion implantation is performed by using thus formed mask 14b to obtain the P-well 3b as shown in FIG. 5. An NMOS transistor having the structure in FIG. 5 may be obtained by following the other steps similarly as in the first embodiment.

In the output NMOS transistor shown in FIG. 5, the bottom surface of the source/drain region 4 does not contact a P-well but contacts the semiconductor substrate 1 having a lower concentration. Further, the P-well 3b does not contact the source/drain region 4, as compared to the normal NMOS transistor shown at the left side in FIG. 5. Therefore, junction capacitance may be further reduced.

Moreover, the number of fabrication steps can be the same as that of a conventional semiconductor device such as an SRAM having a CMOS structure. Therefore, it is not necessary to form additional masks (reticles), and fabrication cost is not increased.

Also in the second embodiment, the structure of an NMOS transistor which is formed on the P-type semiconductor substrate 1 is described similarly as in the first embodiment. It is also possible to form a PMOS transistor having a similar structure on an N-type semiconductor substrate. In this case too, the same advantage can be obtained.

Moreover, the P-well 3b is formed under the element isolation region 2, so that the element separation characteristic may be further improved. The dimension of the element isolation region 2 may be reduced compared to the case where the P-well 3b is not formed under the element isolation region 2. Thus, semiconductor elements can further be reduced in size.

Third Embodiment

Figure 6:
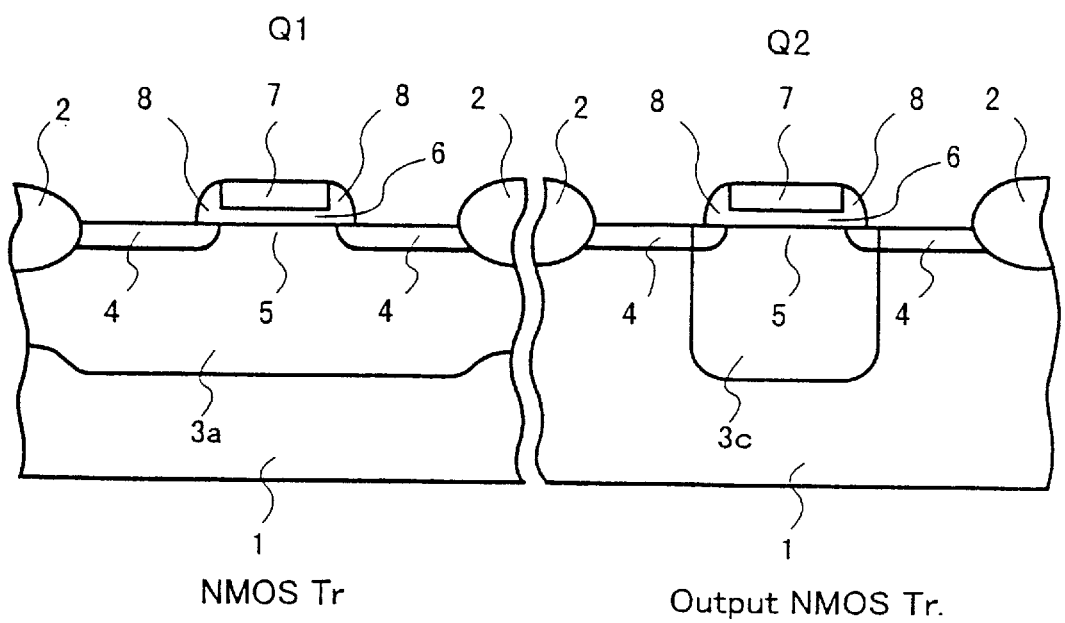
FIG. 6 shows a cross sectional view of a semiconductor device according to a third embodiment of the present invention.

FIG. 6 shows a cross sectional view of a semiconductor device according to a third embodiment of the present invention. In FIG. 6, a cross section of a normal NMOS transistor Q1 (first MOS transistor) comprised in a logic circuit is shown at the left, and a cross section of an NMOS transistor Q2 (second MOS transistor) comprised particularly in an output-portion of an input/output buffer of a logic circuit is shown at the right.

In the case of the first and second embodiments, an output NMOS transistor for an input/output buffer is described which is formed on the P type semiconductor substrate 1. In the structure of the transistor, the P-well 3b is formed under the element isolation region 2 which is formed at the circumference of the active region of the transistor.

In contrast, the third embodiment is different from the first and second embodiments in that the output NMOS transistor of the third embodiment is formed without a P-well under the element isolation region 2. Instead, the element isolation region 2 directly contacts the semiconductor substrate 1 as shown in FIG. 6.

The method for forming the NMOS transistor shown in FIG. 6 is almost the same as that of the first embodiment except the following point. In the step shown in FIG. 4 (c), the P-well 3c can be formed by forming the shape of the mask 14b so as to have an opening portion only on the channel region 5, and by performing ion implantation with thus formed mask. An NMOS transistor having the structure in FIG. 6 may be obtained by following the other steps similarly as in the first embodiment.

In the output NMOS transistor as explained above, the P-well 3c is formed up to a predetermined depth downward from the channel 5, so that a stable well potential may be secured. Moreover, the source/drain region 4 does not form a PN junction with a region having a concentration equal to or more than that of the P-well 3c other than the junction with the P-well 3c.

Therefore, it is possible to reduce junction capacitance as compared to the conventional NMOS transistor Q1 shown at the left in FIG. 6. The number of steps for fabricating the NMOS transistor is not more than that of a conventional CMOSSRAM. Therefore, an increase in fabrication cost due to increase of masks (reticles) is avoided.

Figure 7:
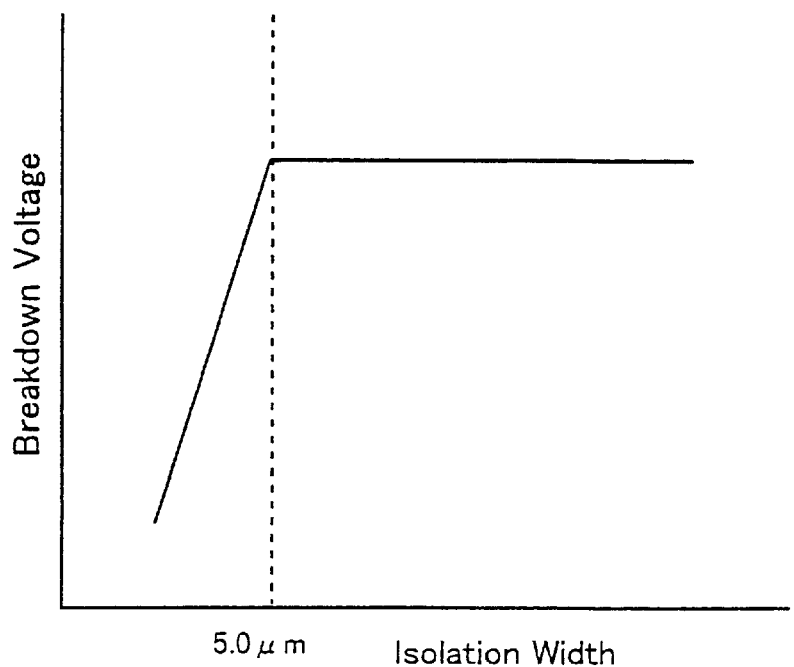
FIG. 7 shows dependency of withstand voltage on the width of an element isolation region between two adjacent active regions, or isolation width, of a MOS transistor according to a third embodiment of the present invention.

An output NMOS transistor having the structure shown in FIG. 6 can be effectively used particularly when the element isolation region 2 can be formed into a sufficient size. From the dependency of withstand voltage on element isolation region dimension (distance between two adjacent active regions, or isolation width) shown in FIG. 7, it is found that an element isolation region has a sufficient element separation capacity when it has a dimension of 5.0 μm or more. In addition, junction capacitance can be reduced without increasing the number of fabrication steps compared to the conventional fabrication method.

In the above embodiment, an output NMOS transistor formed on the P-type semiconductor substrate 1 is shown. In the similar way as above, an output PMOS transistor may be formed on an N-type semiconductor substrate, and the same advantage can be obtained.

Fourth Embodiment

A fourth embodiment of the present invention is described below.

Figure 8:
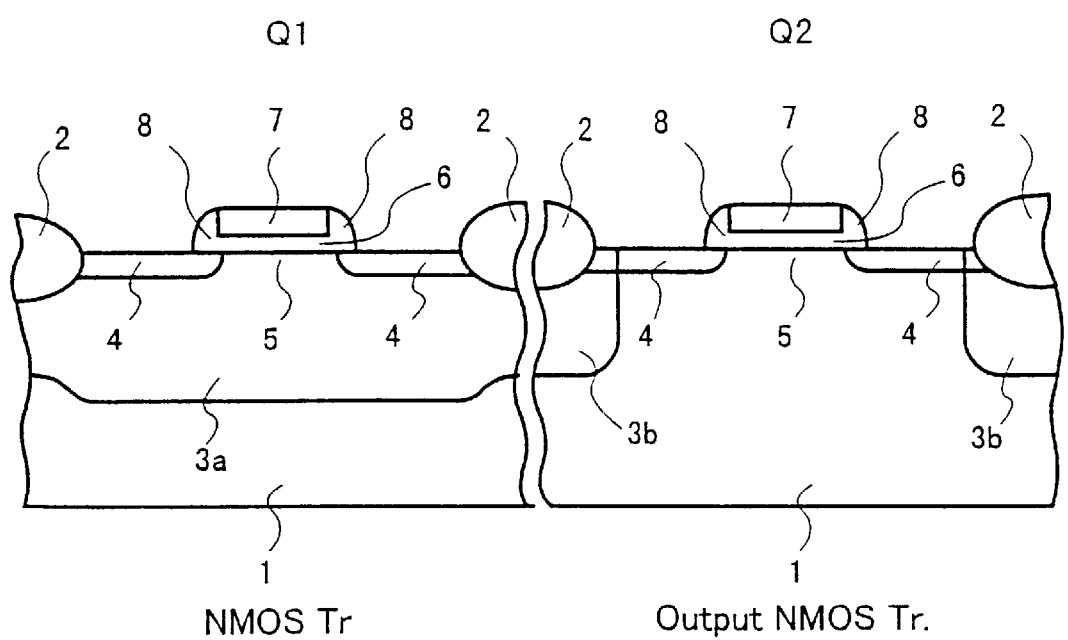
FIG. 8 shows a cross sectional view of a semiconductor device according to a fourth embodiment of the present invention.

FIG. 8 shows a cross sectional view of a semiconductor device according to the fourth embodiment of the present invention. In FIG. 8, a cross section of a normal NMOS transistor Q1 (first MOS transistor) comprised in a logic circuit is shown at the left, and a cross section of an NMOS transistor Q2 (second MOS transistor) comprised in an output-portion of an input/output buffer of a logic circuit is shown at the right.

In the first and second embodiments, the P-well 3b is formed under the element isolation region 2, and the is P-well 3c is formed under the channel region 5. In contrast, the fourth embodiment is different from the first and second embodiments in that the P-well 3c is not formed under the channel region 5, although the P-well 3b is formed under the element isolation region 2 as shown at right side in FIG. 8.

The method for forming the NMOS transistor for forming an output-portion as shown in FIG. 8 is almost the same as that of the first embodiment except for the following point. In this embodiment, in the step shown in FIG. 4(c), the P-well 3b can be formed by forming the shape of the mask 14b so as to have an opening portion only on the element isolation region 2, and by performing ion implantation through thus formed mask 14b. An NMOS transistor having the structure shown in FIG. 8 may be obtained by following the other steps similarly as in the first embodiment.

In the output NMOS transistor shown in FIG. 8, the source/drain region 4 contacts a P-well by a small surface.

In the output NMOS transistor Q2 thus formed, the source/drain capacitance is greatly reduced as compared to the conventional NMOS transistor Q1 as shown at the left in FIG. 8. Further, element separation is attained sufficiently.

Similarly to other embodiments, also in the case of the fourth embodiment, the output NMOS transistor formed on the P-type semiconductor substrate 1 is described. However, needless to say, an output PMOS transistor can be formed on an N-type semiconductor substrate in a similar way, and the same advantage can be obtained.

The methods for fabricating a semiconductor device in the above third and fourth embodiments may be summarized as follows.

In the methods for fabricating a semiconductor device including at least a first and a second MOS transistor, a well of a first impurity concentration is formed in a region for the first MOS transistor. Simultaneously, another well of the first impurity concentration is formed under one of a channel region of the second MOS transistor or an element isolation region surrounding the second MOS transistor. A region of a second impurity concentration is formed for source and drain regions and under the other one of the channel region of the second MOS transistor or an element isolation region surrounding the second MOS transistor, and the second impurity concentration is lower than the first impurity concentration.

Fifth Embodiment

A fifth embodiment of the present invention is described below.

Figure 9:
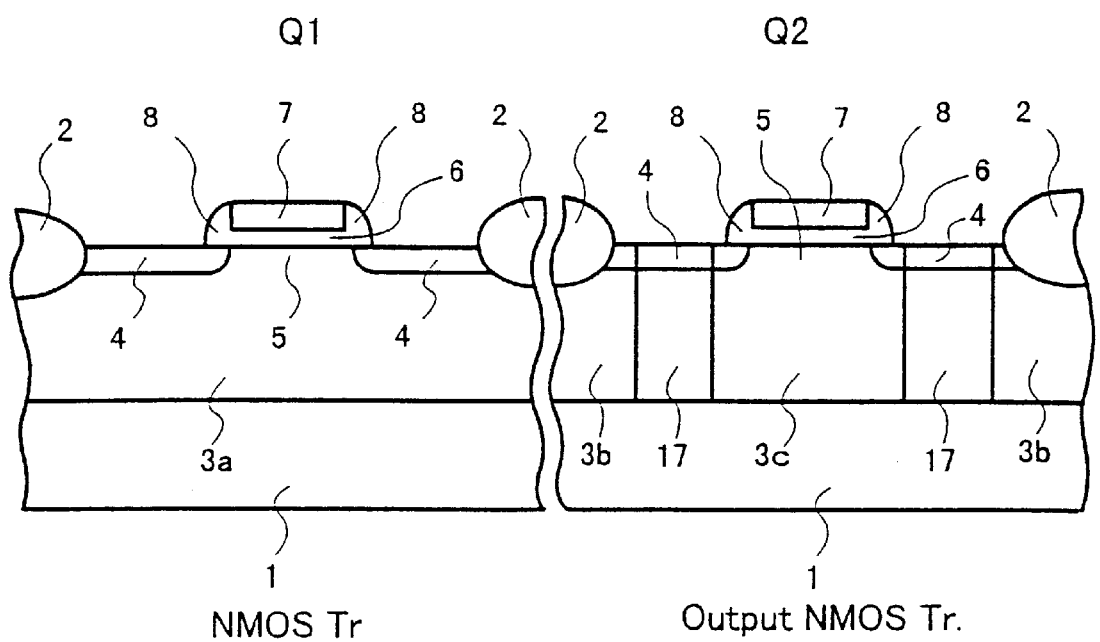
FIG. 9 shows a cross sectional view of a semiconductor device according to a fifth embodiment of the present invention.

FIG. 9 shows a cross sectional view of a semiconductor device according to the fifth embodiment of the present invention. In FIG. 9, a cross section of a normal NMOS transistor Q1 (first MOS transistor) comprised in a logic circuit is shown at the left, and a cross section of an NMOS transistor Q2 (second MOS transistor) comprised in an output-portion of an input/output buffer of a logic circuit is shown at the right.

In the first through fourth embodiments, a well is not formed under the source/drain region 4 of the output NMOS transistor formed on the P-type semiconductor substrate 1. In contrast, the fifth embodiment is different from the above first through fourth embodiments in that the semiconductor device of this embodiment has P-type low-concentration wells 17 formed under the source/drain regions 4 as shown in FIG. 9.

The method for fabricating a CMOS device including the NMOS transistor shown in FIG. 9 is described below with reference to FIG. 10(a) to FIG. 10(d).

Figure 10:
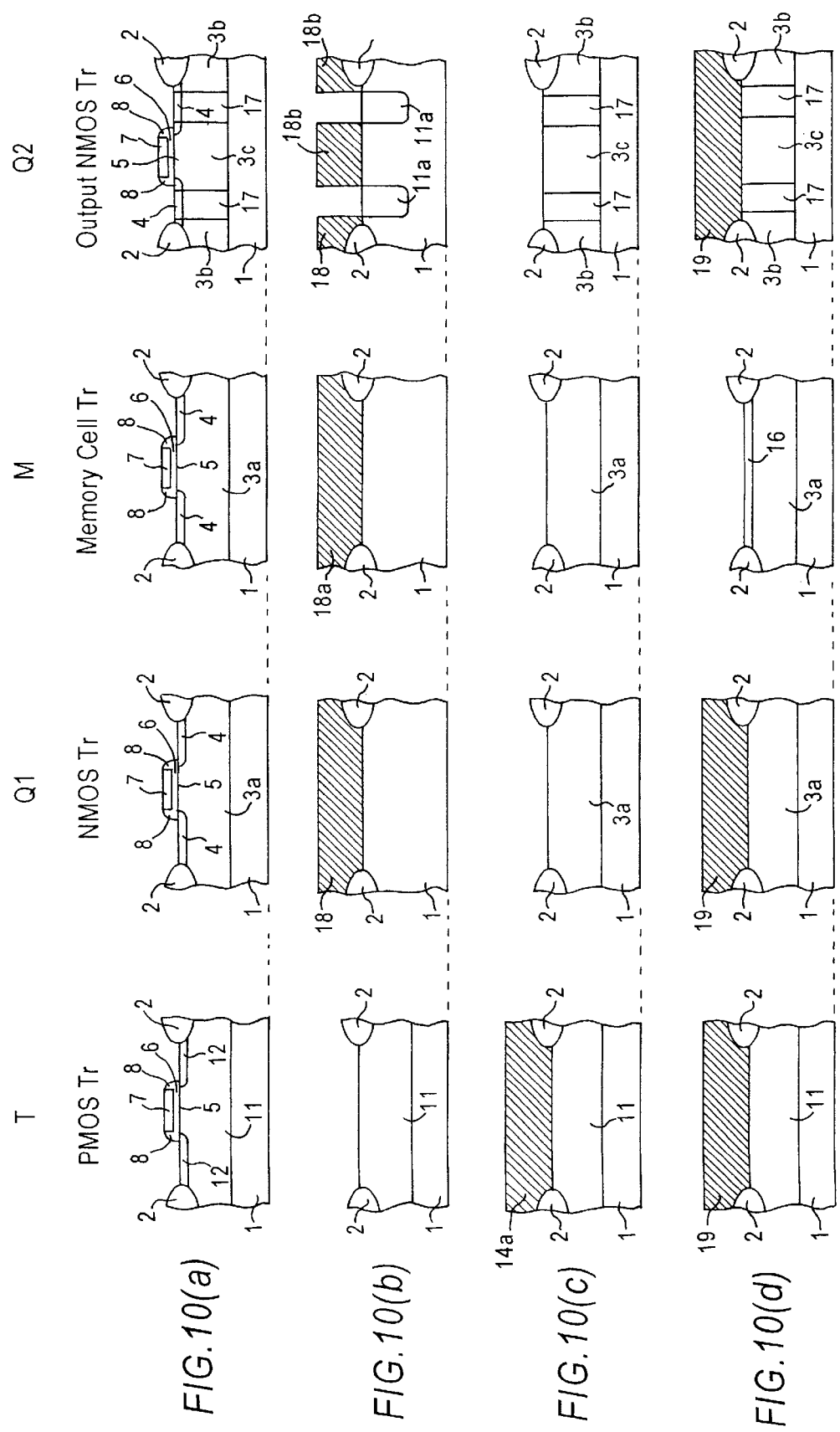
FIG. 10(a) to FIG. 10(d) show a method for fabricating a CMOS device according to the fifth embodiment of the present invention.
Figure 11:
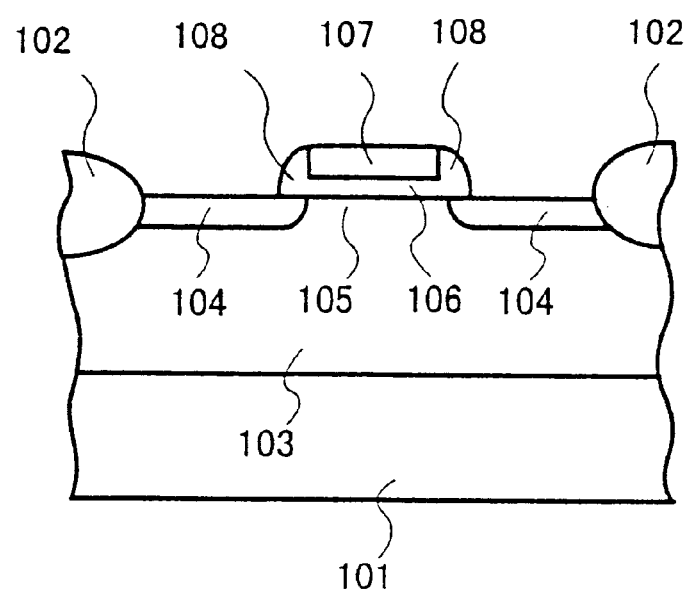
FIG. 11 shows a cross sectional view of a conventional NMOS transistor.
Figure 12:
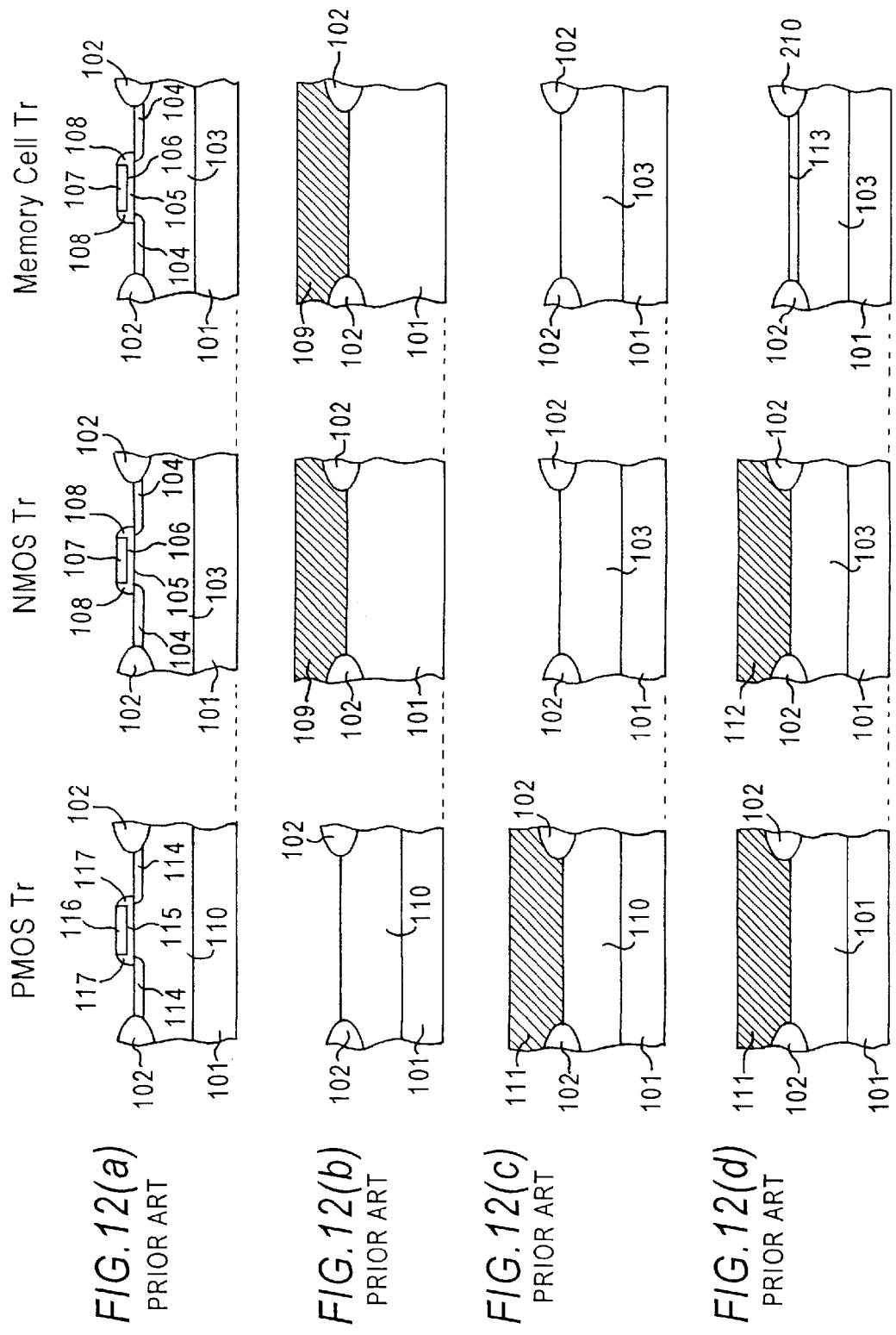
FIG. 12(a) to FIG. 12(d) show a method for fabricating a conventional CMOS semiconductor device.
Figure 13:
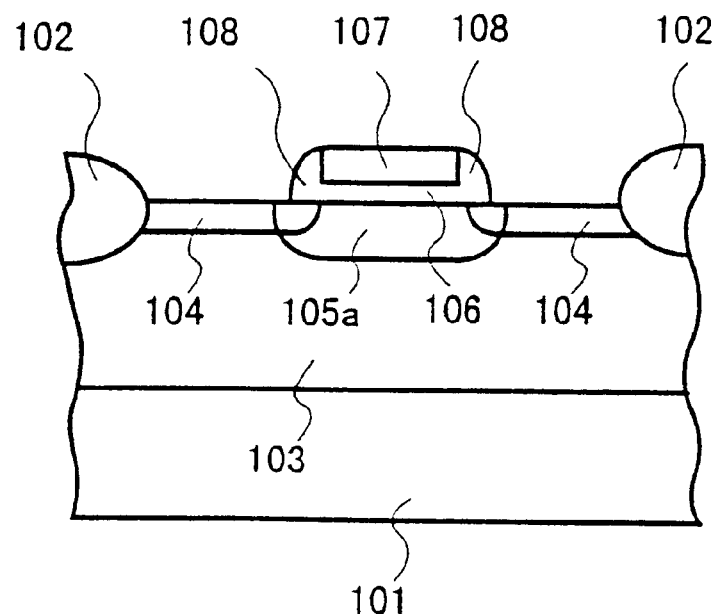
FIG. 13 shows a structure of a conventional NMOS transistor with reduced junction capacitance.
Figure 14:
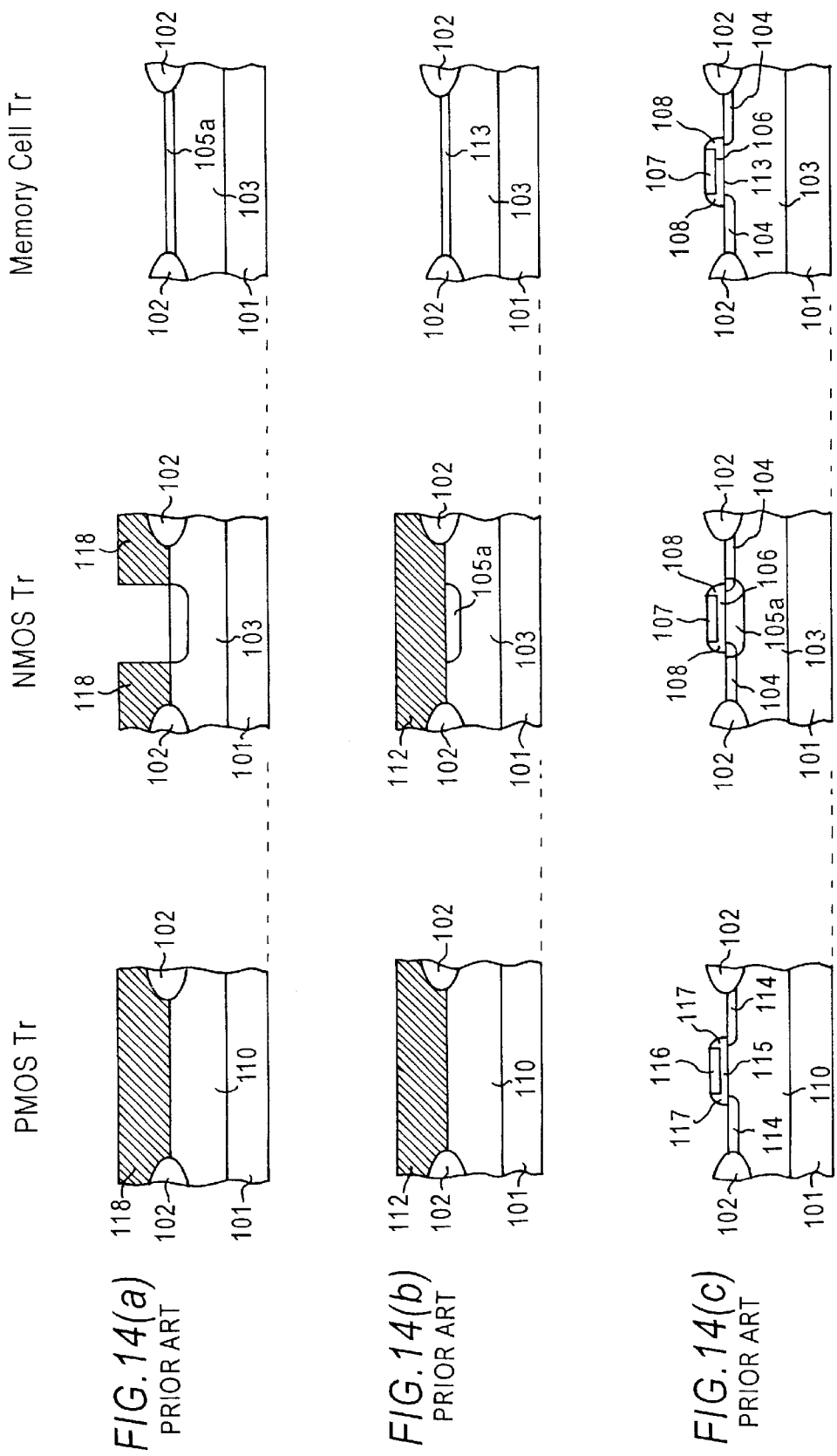
FIG. 14(a) to FIG. 14(c) show a conventional method for fabricating a CMOS semiconductor device.
Figure 15:
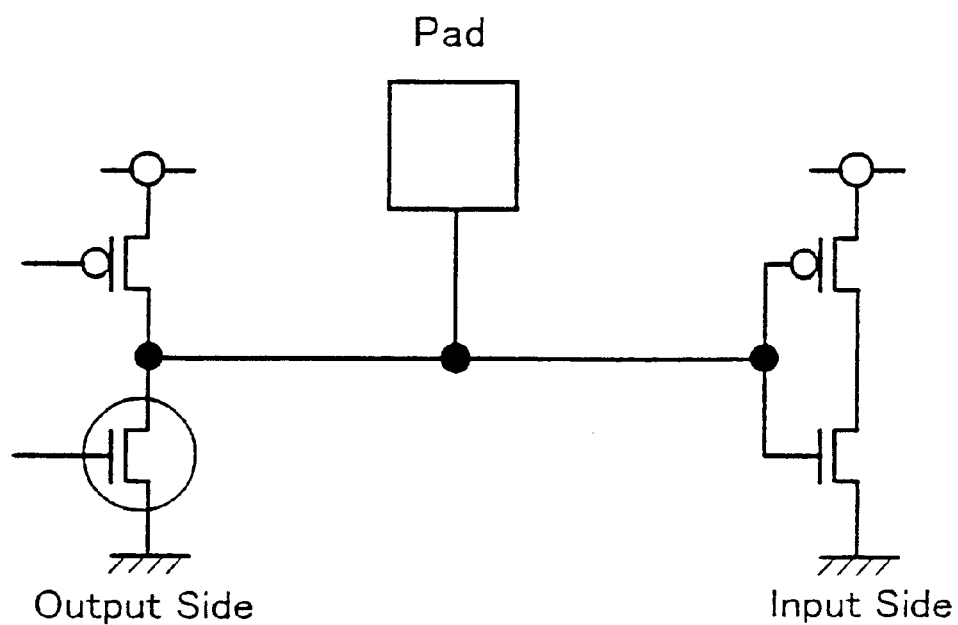
FIG. 15 shows an input/output circuit to explain input/output capacitance

The structure of the CMOS device of the present invention is shown in FIG. 10(a). Shown from the left to right in order in FIG. 10(a) are a normal PMOS transistor T, a normal NMOS transistor Q1 (first MOS transistor), and a memory-cell-forming NMOS transistor M, which are used for a normal logic circuit, and finally an NMOS transistor Q2 (second MOS transistor) used for input/output-buffer output-portion.

In fabricating the semiconductor device, first as shown in FIG. 10(b), the element isolation regions 2 are formed at inactive regions of a principal plane of the semiconductor substrate 1. Thereafter, a mask 18a is formed on the regions of the NMOS transistor and of memory-cell-forming NMOS transistor, and a mask 18b is formed on the element isolation regions 2 around the output NMOS transistor forming region and on the channel forming region for the output NMOS transistor. Then, N-type impurity ion implantation is performed to form the N-well 11 in the PMOS transistor forming region and N-wells 11a in the source/drain regions of the output NMOS transistor Q2. Thereafter, the masks 18a and 18b are removed.

Then, as shown in FIG. 10(c), the mask 14a is formed on the PMOS transistor forming region. Thereafter, P-type impurity ion implantation is performed, and the P-well 3a is formed in the NMOS transistor forming region and in memory-cell transistor forming region respectively. At the same time, P-type impurities are also implanted into the NMOS-transistor forming region for an output-buffer, the P-well 3b is formed under the element isolation regions 2, and the P-well 3c is formed under the channel region respectively (first concentration of impurity). Since the N-wells 11a are already formed in and under the source/drain regions 4 of the output NMOS transistor, the P-type low-concentration wells 17 are produced in and under the regions 4 by implantation of P-type impurities with a concentration lower than those of the P-wells 3a, 3b, and 3c (second concentration of impurity). Thereafter, the mask 14a is removed.

Then, as shown in FIG. 10(d), a mask 19 is formed on regions other than the memory-cell transistor forming region, and ion implantation is performed to form the threshold adjustment layer 16 on the surface of the active region of the memory-cell NMOS transistor to finely adjust the impurity concentration of the channel region. Thereafter, the mask 19 is removed.

By following the above fabrication process, the semiconductor device of CMOS structure shown in FIG. 10(a) can be obtained. The threshold adjustment layer 16 is not illustrated in FIG. 10(a) for simplicity.

In the output NMOS transistor thus formed, the source/drain regions 4 are in contact with the well 17 which has reduced concentration as compared with the P-type semiconductor substrate 1 or a normal P-type well. Therefore, it is possible to reduce the junction capacitance of this portion.

As to the concentration of each well, the P-type low-concentration well 17 of the output NMOS transistor Q5 has the minimum concentration, the N-well 11 of the PMOS transistor T has an intermediate concentration, and the P-wells 3b and 3c of the NMOS transistor Q2 has the maximum concentration. The P-well 3a of the memory-cell transistor also has a concentration almost equal to the concentration of the P-wells 3b and 3c of the NMOS transistor.

The peak impurity concentration of the P-type low-concentration well 17 of the output NMOS transistor Q5 is adjusted to approximately 1.0 E17/cm$^3$ to 3.0 E17/cm$^3$ (second concentration of impurity). The minimum value of the peak impurity concentration is set not smaller than 1.0 E17/cm$^3$. If the impurity concentration is lower than 1.0 E17/cm$^3$, the resistance of a P-well 17 increases, and holes produced due to the hot carrier effect are not sufficiently extracted, resulting in an unstable ground potential. Therefore, it is preferable to set the impurity concentration of a well 17 to a value larger than 1.0 E17/cm$^3$.

In the output NMOS transistor as described above, the P-wells 3b and 3c are formed under the channel region 5 and under the element isolation regions 2 respectively. Thereby, element isolation is enhanced, and well potential is stabilized. Furthermore, since the P-wells 3b and 3c are formed, a semiconductor device of higher-performance is obtained without adding any fabrication steps to the conventional CMOS fabrication method.

Also in the case of the fifth embodiment, an output NMOS transistor is formed on the P-type semiconductor substrate 1 similarly as in the other embodiments. However, needless to say, an output PMOS transistor can be formed on an N-type semiconductor substrate, and the same advantage can be obtained.

The advantageous effects of the present invention are summarized below.

According to one aspect of the present invention, a semiconductor device includes a first MOS transistor having a normal well structure and a second MOS transistor characterized by the well structure. The impurity concentration (second concentration of impurity) of the region under the source/drain region of the second MOS transistor is set to be equal to the impurity concentration of the semiconductor substrate. The impurity concentration (first concentration of the impurity) of a channel region and of a region under the channel region and further the impurity concentration of the region under element isolation regions are set to be equal to the impurity concentration of the well of the first MOS transistor. Therefore, the source/drain regions of the second MOS transistor contact a semiconductor substrate having a concentration lower than that of a normal well. Thereby, the junction capacitance at the source/drain region boundary may be reduced. Further, the element separation characteristic is improved, and the well potential of the region under the channel region may be stabilized.

In another aspect of the present invention, a semiconductor device includes a first MOS transistor having a normal well structure and a second MOS transistor characterized by the well structure. The impurity concentration of the region under the source/drain region of the second MOS transistor is set to be lower than the concentration of the well. Thereby, the source/drain capacitance of the second MOS transistor may be reduced.

In another aspect of the present invention, a semiconductor device includes a first MOS transistor having a normal well structure and a second MOS transistor characterized by the well structure. An impurity region serving as a well of the second MOS transistor is formed under the element isolation region surrounding the active region, and is not formed under the source/drain region. Thereby, the junction capacitance of the boundary portion of source/drain regions may be reduced. Further, element isolation is improved, because of the well formed under the element isolation region. Further, the dimension of the element isolation region may be reduced as compared to the case in which the well in not formed under the isolation region.

In another aspect of the present invention, a semiconductor device includes a first MOS transistor having a normal well structure and a second MOS transistor characterized by the well structure. An impurity region serving as a well of the second MOS transistor is formed in and under the channel region, and is not formed under the source/drain region. Thereby, the junction capacitance of the boundary portion of source/drain regions may be reduced. Further, the element isolation characteristic is improved, because of the well formed under the element isolation region. Further, the potential of the region under the channel region is stabilized, because a well having an impurity concentration equal to or more than a predetermined value is formed in and under the channel region.

In another aspect of the present invention, a semiconductor device includes a first MOS transistor having a normal well structure and a second MOS transistor characterized by the well structure. The second MOS transistor has a structure by which a source/drain capacitance is reduced compared to that of a normal MOS transistor having a normal well structure. For the output portion of an input/output buffer of the semiconductor device, the second MOS transistor is used. Thereby, the output capacitance of the semiconductor device is reduced, and the product specification may be satisfied.

In another aspect of the present invention, a semiconductor device includes a first MOS transistor having a normal well structure and a second MOS transistor characterized by the well structure. The semiconductor device is formed in a 0.4 μm-rule level, and in the second MOS transistor, the distance between a gate electrode and contacts to the source/drain region of the transistor is set at not less than 0.5 μm and not more than 3.0 μm. Thereby, the surge withstand voltage of the MOS transistors is set in an allowable range, and the source/drain junction capacitance is set in an allowable value. Thus, product specification conditions may be met by setting the distance between the gate electrode contact and the contacts to the above value.

According to another aspect of the present invention, in a method of fabricating a semiconductor device, a well is formed for a first MOS transistor having a normal well structure. Simultaneously, wells are formed for a second MOS transistor on regions other than the source/drain region of a second MOS transistor. Thereby, the impurity concentration (second concentration of the impurity) of the region under the source/drain region of the second MOS transistor is adjusted to be lower than the impurity concentration (first concentration of the impurity) of the channel region and of the region under the channel region and further of the region under the element isolation region. Thereby, junction capacitance may be reduced. The characteristic well structure of a second MOS transistor can be formed simultaneously with the formation of the well of a first MOS transistor. Therefore, it is possible to form a high-performance semiconductor device without increasing the number of fabrication steps.

In another aspect of the present invention, in a method of fabricating a semiconductor device, a well is formed for a first MOS transistor having a normal well structure. Simultaneously, a well is formed under the element isolation region located around a second MOS transistor, or a well is formed in a channel region and a region under the channel region. Thereby, the impurity concentration (second concentration of the impurity ) of the region under the source/drain region of the second MOS transistor is adjusted so as to be lower than the impurity concentration (first concentration of the impurity) of the channel region and the region under the channel region and further of the region under the element isolation region. Thereby, the junction capacitance of the source/drain region may be reduced. The characteristic structure of the second MOS transistor can be formed simultaneously with formation of the well of the first MOS transistor. Therefore, it is possible to form a high-performance semiconductor device without increasing the number of fabrication steps.

What is claimed is:

1. A semiconductor device comprising:

a semiconductor substrate;

a plurality of element isolation region formed on the substrate;

at least one first MOS transistor having first source and drain regions of a first conductive type and a first channel region formed therebetween, and formed between two neighboring element isolation regions on a well region of a second conductive type;

at least one second MOS transistor formed on the substrate between two neighboring element isolation regions, and having second source and drain regions of the first conductive type and a second channel therebetween;

at least one first sub-well region of the second conductive type formed in the substrate below a top surface of the second channel region; and a plurality of second sub-well regions of the second conductive type formed in the substrate below the element isolation regions and spaced apart from the first sub-well region, the plurality of second sub-well regions partially overlapping the second source and drain regions at edges of the element isolation regions wherein the well region and the first and second sub-well regions have substantially the same impurity concentration of the second conductive type and are of substantially the same depth below an upper surface of the substrate.

2. The semiconductor device according to claim 1, wherein the well region and the first and second sub-well regions have an impurity concentration of the second conductive type greater than a second type impurity concentration of the substrate.

3. The semiconductor device according to claim 1, wherein the first sub-well region partially overlaps the second source and drain regions at both sides of the second channel region.

4. The semiconductor device according to claim 1, wherein the semiconductor device further comprises a contact formed on and extending to at least one of the second source and drain regions, wherein a distance between a gate electrode of the second MOS transistor and the contact is about 0.5 μm to about 3.0 μm.

5. A semiconductor device comprising:

a semiconductor substrate;

a plurality of element isolation regions formed on the substrate;

at least one first MOS transistor having first source and drain regions of a first conductive type and a first channel region formed therebetween, and formed between two neighboring element isolation regions and on a well region of a second conductive type formed on the substrate;

at least one second MOS transistor having second source and drain regions of the first conductive type and a second channel region formed therebetween, and formed between two neighboring element isolation regions on the substrate; and a plurality of sub-wells of the second conductive type formed spaced apart from each other in the substrate below the element isolation regions in an output portion of an input/output buffer region of said semiconductor device, the plurality of sub-wells partially overlapping the second source and drain regions at edges of the element isolation regions, wherein the well region and sub-wells have substantially the same impurity concentration of the second conductive type and are of substantially the same depth below an upper surface of the substrate.

6. The semiconductor device according to claim 5, wherein the well region and sub-wells have an impurity concentration of the second conductive type greater than a second conductive type impurity concentration of the substrate.

7. The semiconductor device according to claim 5, wherein the semiconductor device further comprises a contact formed on and extending to at least one of the second source and drain regions, wherein a distance between a gate electrode of the second MOS transistor and the contact is about 0.5 μm to about 3.0 μm.

* * * * *